(12) United States Patent
Wang et al.

(10) Patent No.: US 9,659,873 B2
(45) Date of Patent: May 23, 2017

(54) SEMICONDUCTOR STRUCTURE WITH ALIGNING MARK AND METHOD OF FORMING THE SAME

(71) Applicant: UNITED MICROELECTRONICS CORP., Hsin-Chu (TW)

(72) Inventors: Ying-Chiao Wang, Changhua County (TW); Yu-Hsiang Hung, Tainan (TW); Chao-Hung Lin, Changhua County (TW); Ssu-I Fu, Kaohsiung (TW); Chih-Kai Hsu, Tainan (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/836,947

(22) Filed: Aug. 26, 2015

(65) Prior Publication Data
US 2017/0062349 A1   Mar. 2, 2017

(51) Int. Cl.
| | |
|---|---|
| *H01L 29/06* | (2006.01) |
| *H01L 21/765* | (2006.01) |
| *H01L 21/762* | (2006.01) |
| *G03F 9/00* | (2006.01) |
| *H01L 23/544* | (2006.01) |
| *H01L 21/28* | (2006.01) |
| *H01L 21/311* | (2006.01) |
| *H01L 21/033* | (2006.01) |

(52) U.S. Cl.
CPC ........ *H01L 23/544* (2013.01); *H01L 21/0337* (2013.01); *H01L 21/28008* (2013.01); *H01L 21/31144* (2013.01); *H01L 2223/5442* (2013.01); *H01L 2223/5446* (2013.01); *H01L 2223/54426* (2013.01)

(58) Field of Classification Search
CPC ..... H01L 29/06; H01L 21/765; H01L 21/762; H01L 23/544; H01L 21/28008; H01L 21/31144; H01L 21/0337; H01L 2223/54426; H01L 2223/5446; H01L 2223/5442; G03F 9/00
USPC .................................................. 257/797, 401
See application file for complete search history.

(56) References Cited

U.S. PATENT DOCUMENTS

| | | | |
|---|---|---|---|
| 5,695,897 A | 12/1997 | Mitome | |
| 5,868,560 A * | 2/1999 | Tamada | G03F 7/70633 430/22 |
| 6,071,656 A | 6/2000 | Lin | |
| 6,093,511 A | 7/2000 | Tanaka | |

(Continued)

*Primary Examiner* — Alexander Oscar Williams
(74) *Attorney, Agent, or Firm* — Winston Hsu; Scott Margo

(57) ABSTRACT

The present invention provides a semiconductor structure comprising a wafer and an aligning mark. The wafer has a dicing region which comprises a central region, a middle region surrounds the central region, and a peripheral region surrounds the middle region. The aligning mark is disposed in the dicing region, wherein the alignment mark is a mirror symmetrical pattern. The aligning mark comprises a plurality of second patterns in the middle region and a plurality of third patterns disposed in peripheral region, wherein each third pattern comprises a plurality of lines, and a width of the line is 10 times less than a width of the L-shapes. The present invention further provides a method of forming the same.

10 Claims, 14 Drawing Sheets

(56) References Cited

U.S. PATENT DOCUMENTS

| | | | | |
|---|---|---|---|---|
| 6,114,072 | A * | 9/2000 | Narimatsu | G03F 1/14 355/53 |
| 6,132,910 | A * | 10/2000 | Kojima | H01J 37/3045 257/E23.179 |
| 6,228,743 | B1 * | 5/2001 | Chen | G03F 9/70 257/797 |
| 6,842,225 | B1 * | 1/2005 | Irie | G03F 7/70475 355/53 |
| 7,005,718 | B2 | 2/2006 | Wester | |
| 7,405,025 | B2 | 7/2008 | Yaegashi | |
| 9,142,641 | B1 * | 9/2015 | Lin | H01L 29/6656 |
| 2002/0100012 | A1 * | 7/2002 | Sutani | G03F 7/70641 716/53 |
| 2003/0164353 | A1 * | 9/2003 | Tsubata | G03F 7/70633 216/2 |
| 2012/0256173 | A1 * | 10/2012 | Kitamura | C07D 209/86 257/40 |
| 2014/0065736 | A1 | 3/2014 | Amir | |
| 2015/0303119 | A1 * | 10/2015 | Tamaso | H01L 29/66053 438/14 |

* cited by examiner

SEMICONDUCTOR STRUCTURE WITH ALIGNING MARK AND METHOD OF FORMING THE SAME

BACKGROUND OF THE INVENTION

1. Field of the Invention

The present invention provides a semiconductor structure and a method of forming the same, and more particularly, the present invention provides a semiconductor structure with novel aligning marks and method of making the same.

2. Description of the Prior Art

Micro-processor systems comprised of integrated circuits (IC) are ubiquitous devices in modern society, being utilized in such diverse fields as automatic control electronics, mobile communication devices and personal computers. With the development of technology and the increasingly imaginative applications of electrical products, IC devices are becoming smaller, more delicate and more diversified.

With increasing miniaturization of semiconductor devices, it is crucial to maintain the efficiency of miniaturized semiconductor devices in the industry. However, as the size of the field effect transistors (FETs) is continuously shrunk, the development of the planar FETs faces more limitations in the fabricating process thereof. On the other hand, non-planar FETs, such as the fin field effect transistor (FinFET) have three-dimensional structure, not only capable of increasing the contact to the gate but also improving the controlling of the channel region, such that the non-planar FETs have replaced the planar FETs and become the mainstream of the development.

In current techniques, in order to meet the sub-lithographic requirements, a regular photolithography and an etching process are provided to form fin structures in the Fin-FETs. Additionally, the fabrication of semiconductor device also utilizes a pattern transfer technique, such as the sidewall image transfer (SIT) process, to form required fin structures. However, although being beneficial to fabricate the fin structures in finer critical dimension (CD), the pattern transfer technique also complicates the fabrication process of FinFET. Furthermore, the current fabrication process also faces more limitations, such as the misaligning problem since the CD has reached a very small value. Thus, there is still a requirement to have a novel aligning mark specifically used for SIT process for forming the FinFET.

SUMMARY OF THE INVENTION

The present invention therefore provides a semiconductor structure with novel aligning marks.

According to one embodiment, the present invention provides a semiconductor structure comprising a wafer and an aligning mark. The wafer has a dicing region which comprises a central region, a middle region surrounds the central region, and a peripheral region surrounds the middle region. The aligning mark is disposed in the dicing region, wherein the alignment mark is a mirror symmetrical pattern. The aligning mark comprises a plurality of second patterns in the middle region and a plurality of third patterns disposed in peripheral region, wherein each third pattern comprises a plurality of lines, and a width of the line is 10 times less than a width of the L-shapes.

According to another embodiment, a method of forming a semiconductor structure is provided. A wafer with a dicing region is provided, the dicing region comprises a central region, a middle region surrounds the central region, and a peripheral region surrounds the middle region. Next, an aligning mark is formed in the dicing region, wherein the aligning mark is a mirror symmetrical pattern and comprises a plurality of second patterns in the middle region and a plurality of third patterns in the third region, each third pattern has a plurality of lines and the lines comprises a plurality of inner lines which are formed by a sidewall image transfer (SIT) process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
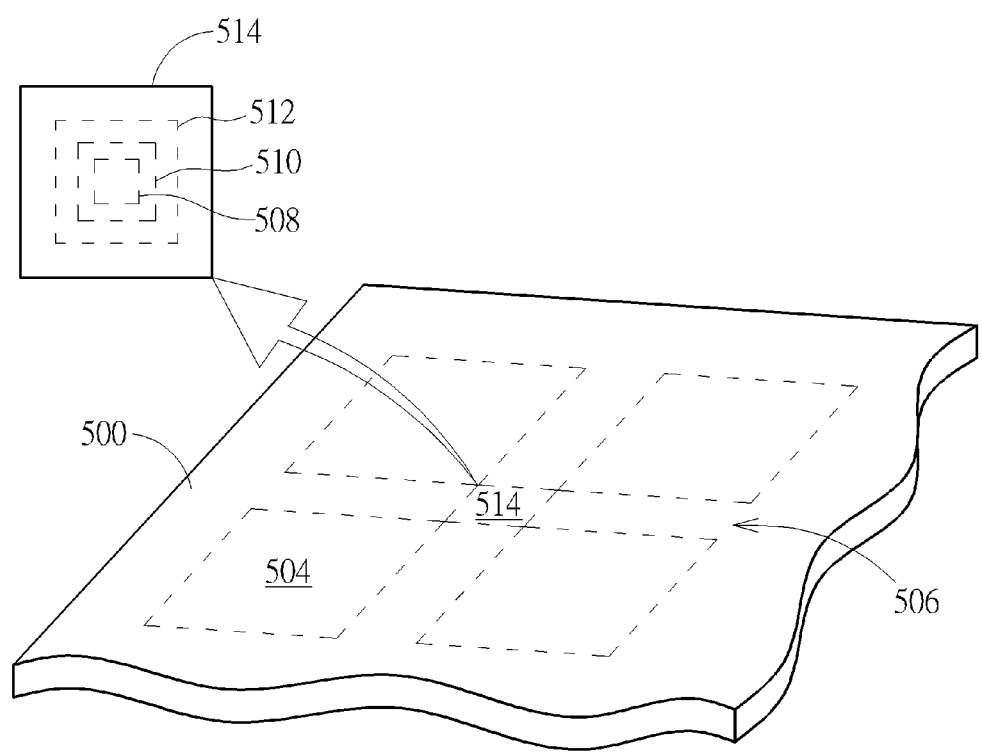
FIG. 1 shows a schematic diagram of a wafer having the semiconductor structures according to one embodiment of the present invention.

Please refer to FIG. 1, which shows a schematic diagram of a wafer having the semiconductor structures according to one embodiment of the present invention. As shown in FIG. 1, a wafer 500 is provided. The wafer 500 includes a plurality of die regions 504 and a dicing region 506. In one embodiment, the die regions 504 are arranged in an array manner and each die region 504 is encompassed by the dicing region 506. In the subsequent process, various semiconductor structures (not shown) such as Fin-FETs will be formed in the die regions 504 for executing logic or non-logic process, and thereafter, a dicing process will be carried out along a central line of the dicing region 506 for example, to separate each dicing region 504 into a single die. On the other hand, in order to ensure the aligning in different processes, a plurality of aligning marks (not shown) will be formed simultaneously in the dicing region 506, such as in the region 514 which is located in the intersection cross between four die regions 504. As shown in an enlarged figure of region 514, there are three regions including a central region 508, a middle region 510, a peripheral region 512, which are concentrically arranging and are not overlapping with each other. However, it is understood that instead of the region 514, the aligning marks can be formed in other regions in the dicing region 514.

Please refer to FIG. 2A, FIG. 2B, FIG. 3A, FIG. 3B, FIG. 3C, FIG. 4A, FIG. 4B, FIG. 5A, FIG. 5B, FIG. 6A, FIG. 6B, FIG. 6C, FIG. 7A, FIG. 7B, FIG. 8A, FIG. 8B, FIG. 8C, FIG. 9A, FIG. 9B, FIG. 10A, FIG. 10B and FIG. 10C, which show schematic diagrams of the method of forming aligning marks according to one embodiment of the present invention, wherein FIG. 1B, FIG. 2B, FIG. 3B, FIG. 4B, FIG. 5B, FIG. 6B, FIG. 7B, FIG. 8B, FIG. 9B and FIG. 10B are top views and FIG. 2A, FIG. 3A, FIG. 4A, FIG. 5A, FIG. 6A, FIG. 7A, FIG. 8A, FIG. 9A and FIG. 10A are cross-sectional view taken along line AA' in FIG. 1B, FIG. 2B, FIG. 3B, FIG. 4B, FIG. 5B, FIG. 6B, FIG. 7B, FIG. 8B, FIG. 9B and FIG. 10B, respectively. FIG. 3C, FIG. 6C, FIG. 8C and FIG. 10C are schematic diagrams of the first patterned layer, the second patterned layer, the third patterned layer and the aligning mark, respectively.

Figure 2A:
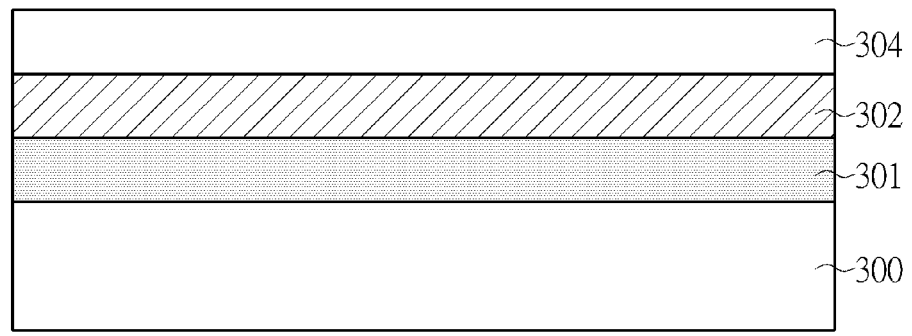
FIG. 2A, FIG. 2B, FIG. 3A, FIG. 3B, FIG. 3C, FIG. 4A, FIG. 4B, FIG. 5A, FIG. 5B, FIG. 6A, FIG. 6B, FIG. 6C, FIG. 7A, FIG. 7B, FIG. 8A, FIG. 8B, FIG. 8C, FIG. 9A, FIG. 9B, FIG. 10A, FIG. 10B and FIG. 10C, which show schematic diagrams of the method of forming aligning marks according to one embodiment of the present invention.
Figure 2B:
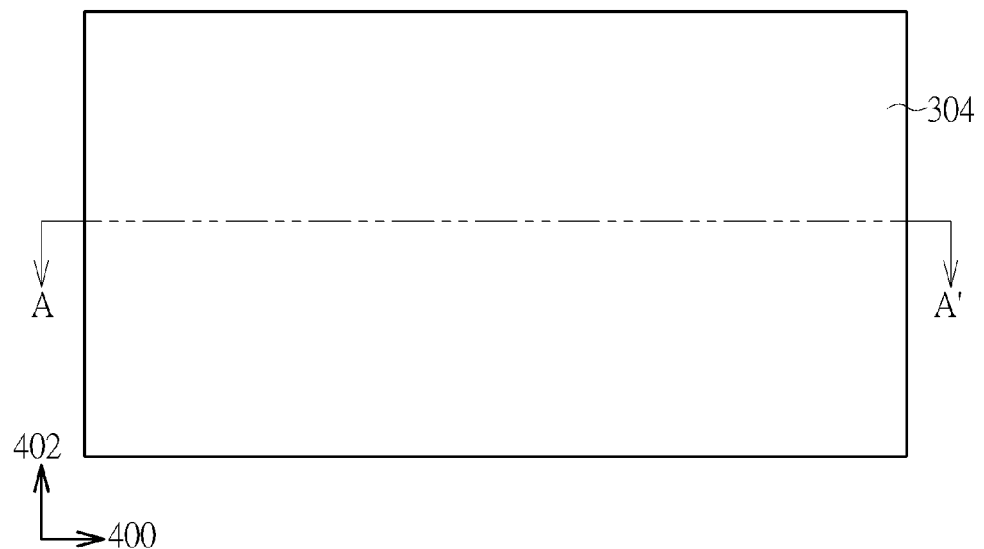

For forming the aligning mark provided in the present invention, first please see FIGS. 2A and 2B. A substrate 300 is provided. The substrate 300 can be served as abase for forming devices, components, or circuits. In one embodiment, the substrate 300 is a semiconductor substrate such as silicon substrate, epitaxial silicon substrate, silicon germanium substrate, silicon-on-insulator (SOI) substrate, and is not limited thereto. In another embodiment, the substrate 300 includes a semiconductor substrate and at least one material layer (not shown) disposed on the semiconductor substrate. A gate layer 301, a mask layer 302 and a material layer 304 are formed sequentially on the substrate 300. In one embodiment, the gate layer 301 includes conductive materials such as metal or poly-silicon. In one embodiment, the mask layer 302 can be made of any material that is suitable as a mask such as silicon nitride (SiN), silicon oxide ($SiO_2$), silicon oxynitride (SiON), silicon carbide (SiC) or advanced pattern film (APF) provided by Applied Material Corp., but is not limited thereto. The mask layer 302 can be a single layer or a multi-layer. In one embodiment, the mask layer 302 is a single layer made of $SiO_2$. The material layer 304 has an etching selectivity with respect of the mask layer 302 and in one embodiment, the material layer 304 is comprised of amorphous silicon with a thickness of 1200 angstroms for example.

Figure 3A:
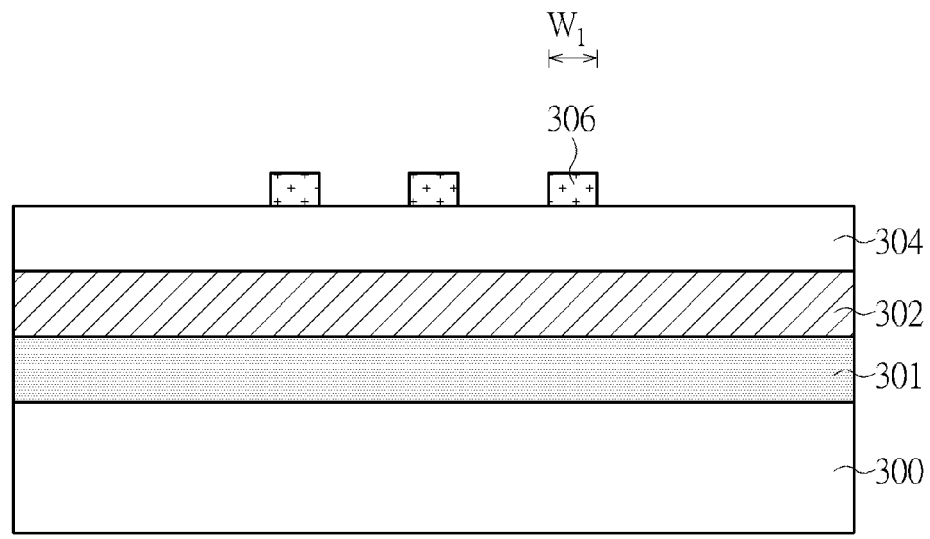
Figure 3B:
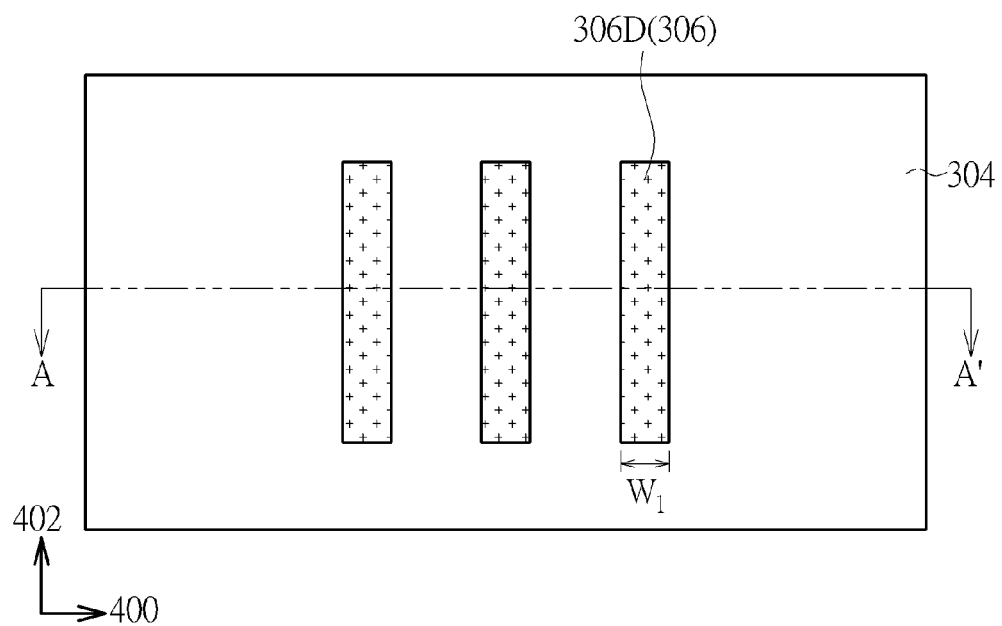

As shown in FIG. 3A and FIG. 3B, a first patterned layer 306 is formed on the material layer 304. In one embodiment, the first patterned layer 306 can be of a tri-layered such as a bottom photoresist layer/an anti-reflective layer/a top photoresist layer. For example, the first patterned layer may be an ODL/a SHB layer/a 193 nm PR, wherein ODL is an abbreviation of organic dielectric layer, SHB is an abbreviation of silicon-containing hard-mask bottom anti-reflection coating, and 193 nm PR is a specific kind of photoresist that can be decomposed by a light source with a wavelength of 193 nanometers. The fabrication process for the bottom photoresist layer/the anti-reflective layer/the top photoresist layer may include the following steps. First, a bottom PR layer, like an ODL, is coated on the material layer 304 and a baking procedure may further be performed optionally. Subsequently, an anti-reflective layer, such as an SHB, is formed. The composition of the SHB layer is organosilicon polymers or polysilane, which comprises at least a chromophore group, a crosslinkable group and a cross-linking agent. Finally, the top PR layer, such as 193 nm PR, is coated on the SHB layer. In this case, the top PR layer does not need to be very thick since the top PR layer mainly serves as a dry etch hard mask and the pattern defined therein only needs to be transferred from itself to the underlying SHB layer during the corresponding pattern transfer process. In another case, the composition of the amorphous carbon layer/the anti-reflective layer/the PR layer may respectively be an advanced patterning film (APF)/a SHB layer/a 193 nm PR. It should be noted that since the advanced patterning film (a type of amorphous carbon layer) has a high aspect ratio (HAR), a low line edge roughness (LER) and a PR-like ashability, it is widely used in advanced semiconductor processes. As shown in FIG. 3B, the first patterned layer 306 have a plurality of first line patterns 306D stretching along a same direction, such as a second direction 402, which is perpendicularly to a first direction 400.

Figure 3C:
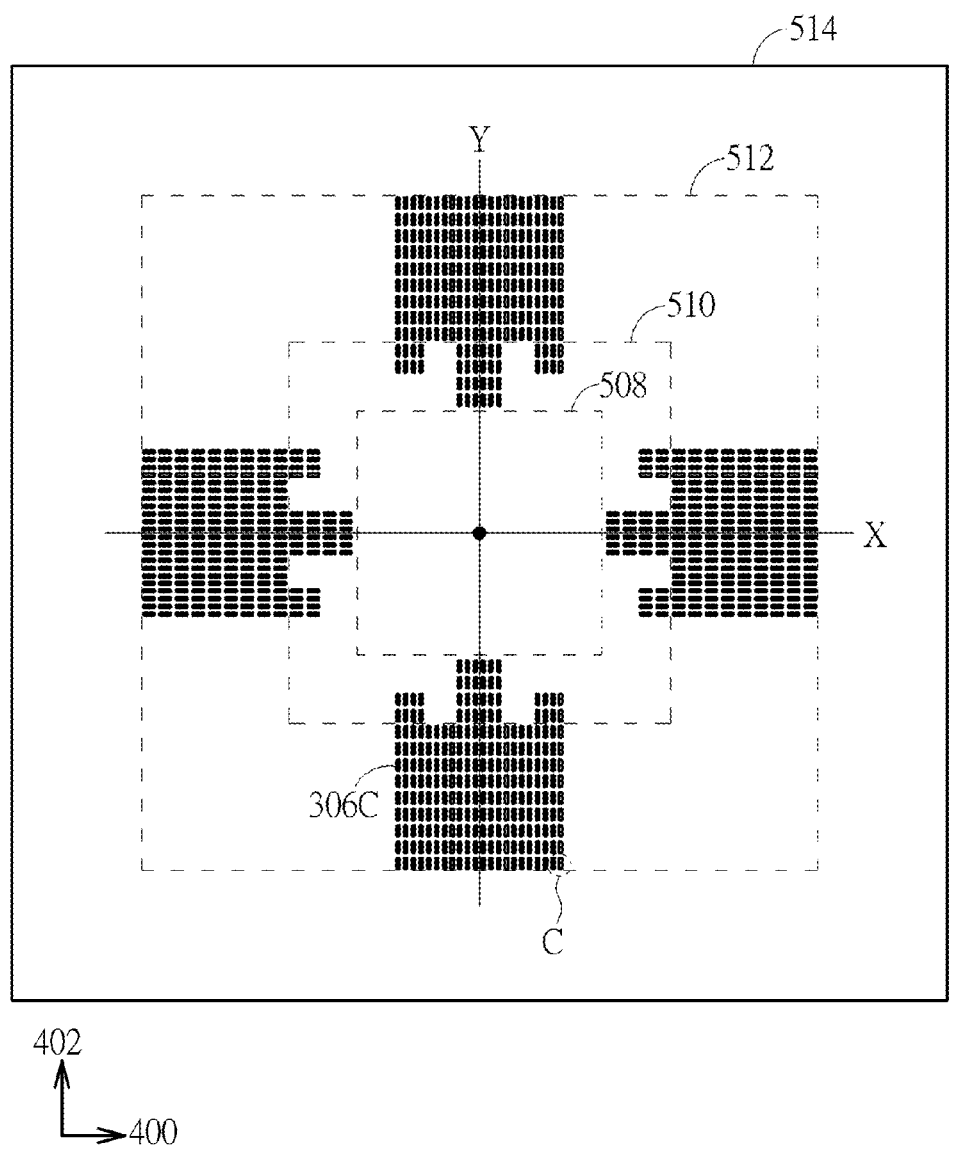

Regarding to the enlarged picture showing an overall picture of the first patterned layer 304 in region 514, please see FIG. 3C, wherein circle C shows the enlarged area in FIG. 3C correspondingly. As shown in the top view, the first patterned layer 306 generally has a cross shape. Detail speaking, the first patterned layer 306 is a mirror symmetrical pattern, which is symmetrically both along line X and Y that are intersecting at a center of the first patterned layer 306. As shown in FIG. 3C, the first patterned layer 306 has a plurality first blocks 306C located in the middle region 508 and the peripheral region 510. Each first blocks 306C preferably has a rectangular contour, and an enlarged figure of each first block 306C can be shown in FIG. 3B correspondingly. In this embodiment, each first block 306C has three first line patterns 306D, which has a first width $W_1$ about 50~60 angstroms. With reference back to FIG. 3C, it is noted that some first line patterns 306D in each first block 306B are stretching along the second direction 402 (those near top side and bottom side of FIG. 3C), while another first line patterns 306D are stretching along the first direction 400 (those near left side and right side of FIG. 3C).

Figure 4A:
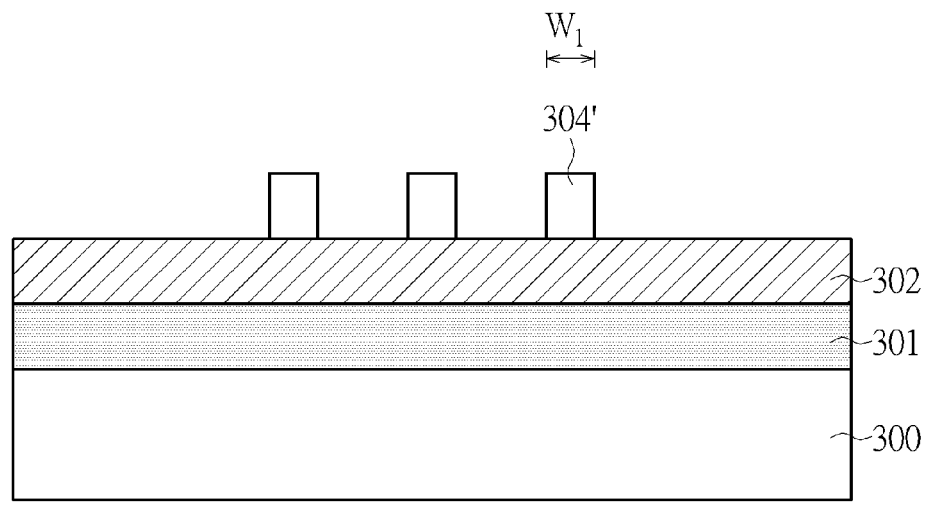
Figure 4B:
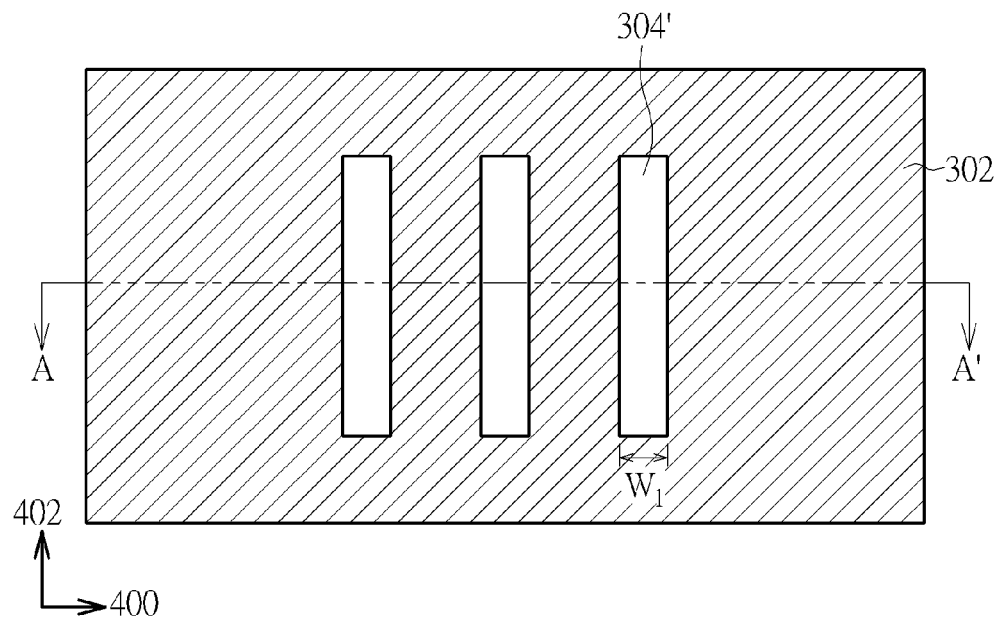

Next, as shown in FIG. 4A and FIG. 4B, the material layer 304 is patterned by using the first patterned layer 306 as a mask. The pattern of the first patterned layer 306 is therefore transfer to the material layer 304, thereby forming a patterned material layer 304'. The line width of the patterned material layer has a width $W_1$, which is about 70 angstroms for example.

Figure 5A:
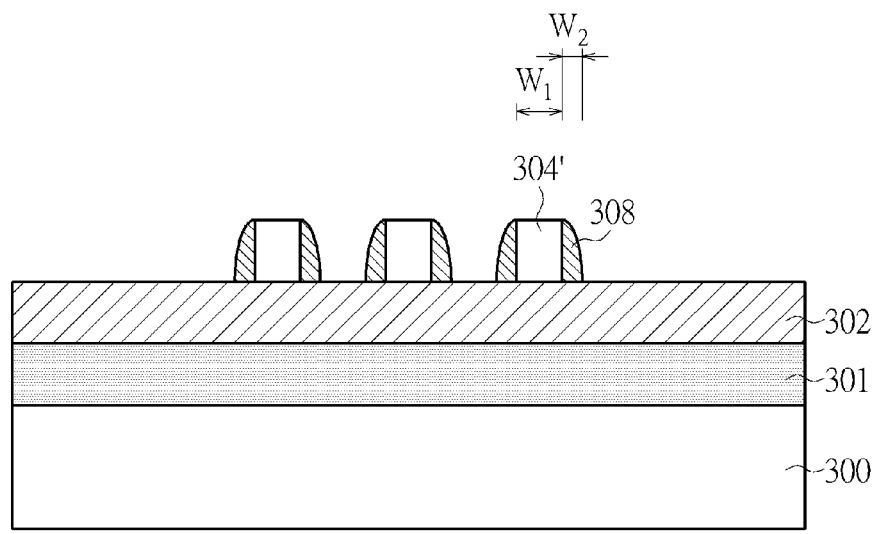
Figure 5B:
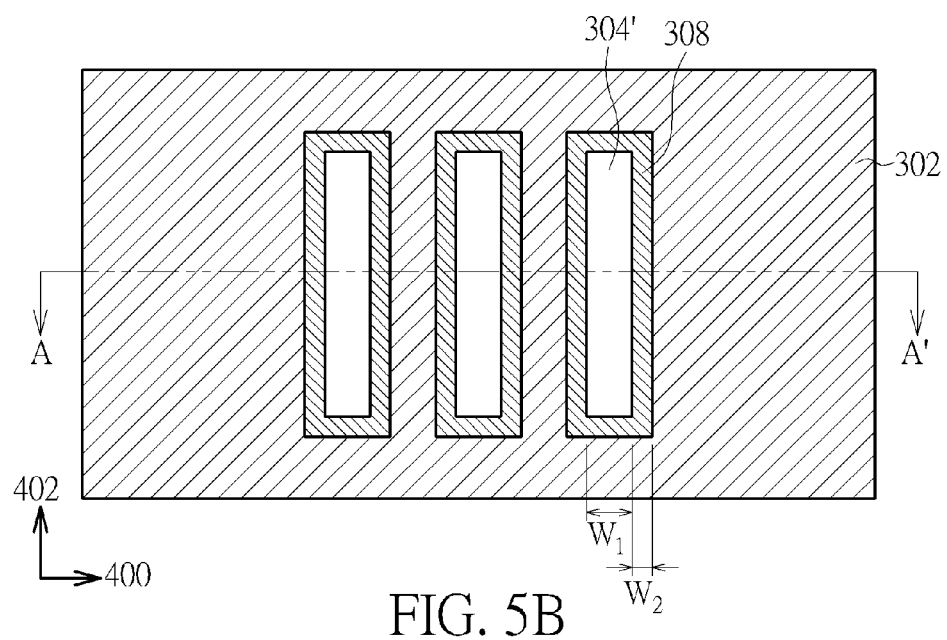

Subsequently, as shown in FIG. 5A and FIG. 5B, a spacer 308 is formed on sidewalls of the patterned material layer 304'. In one embodiment, the method for forming the spacer 308 includes, forming a spacer material layer (not shown) conformally on the mask layer 302 and the patterned material layer 306', and an anisotropically etching the spacer material layer until exposing top surface of the patterned material layer 304'. In one embodiment, the spacer 308 has a width $W_2$ substantially between 5 to 15 angstroms. As shown in a top view of FIG. 5B, the spacer 308 surrounds the patterned material layer 304' to form a closed loop, such as a closed rectangle. The spacer 308 includes a material that has an etching selectivity with respect to the patterned material layer 304' and the mask layer 302. In one embodiment, the spacer 308 is made of SiN.

Figure 6A:
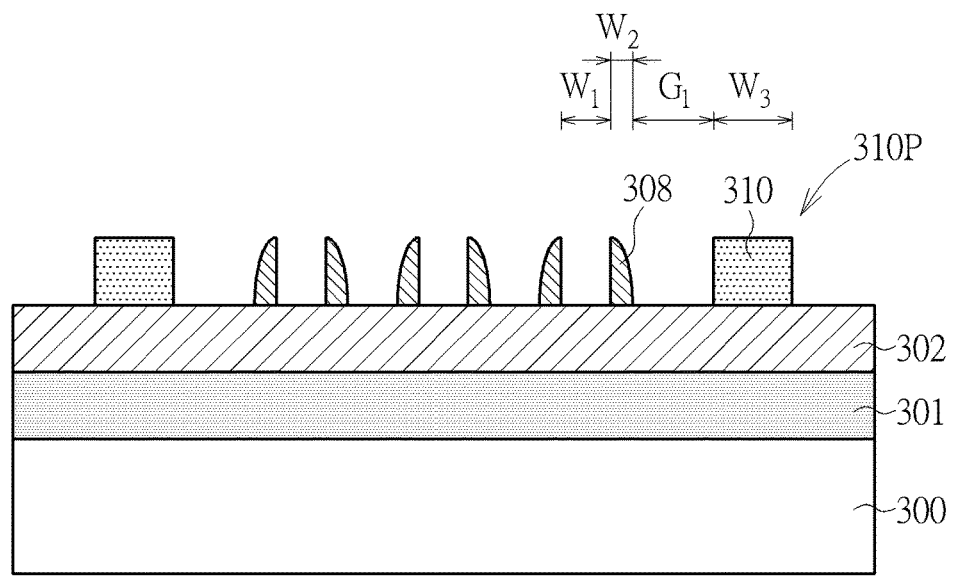
Figure 6B:
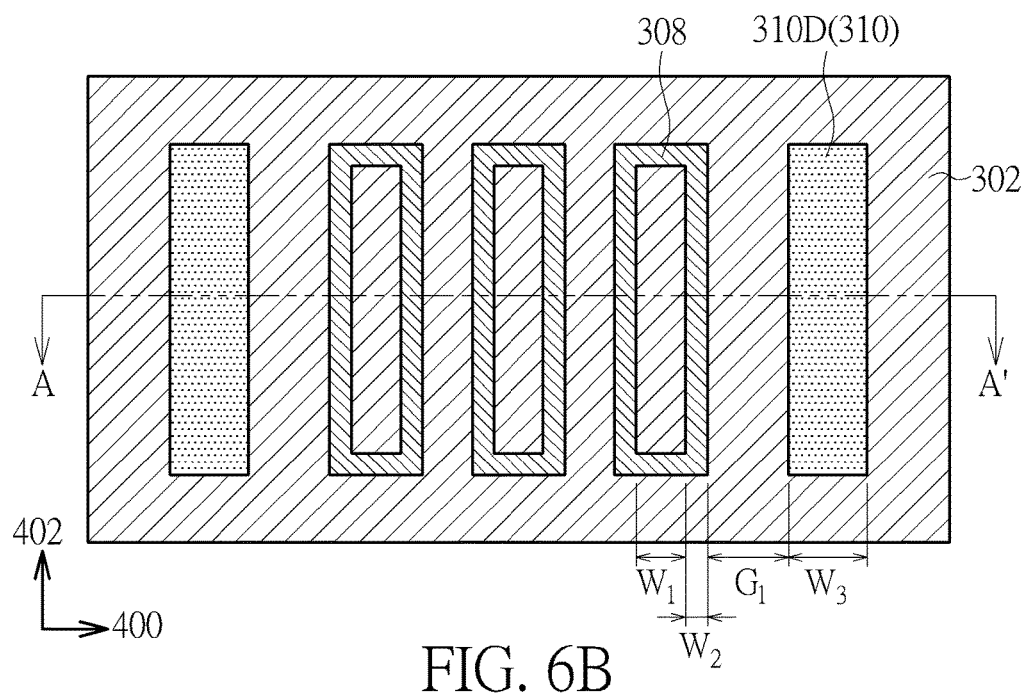

As shown in FIG. 6A and FIG. 6B, after removing the patterned material layer 304, a second patterned layer 310 is formed on the mask layer 302, by using the first patterned layer 306 for aligning. The second patterned layer 310 has a line width $W_3$ greater than the width $W_1$ of the spacer 308, for example, five times greater than the width $W_1$. In one embodiment, $W_2$ is about 70 to 80 angstroms. A gap $G_1$ is disposed between the spacer 308 and the second patterned layer 310 and preferably is equal to the first width $W_1$.

Figure 6C:
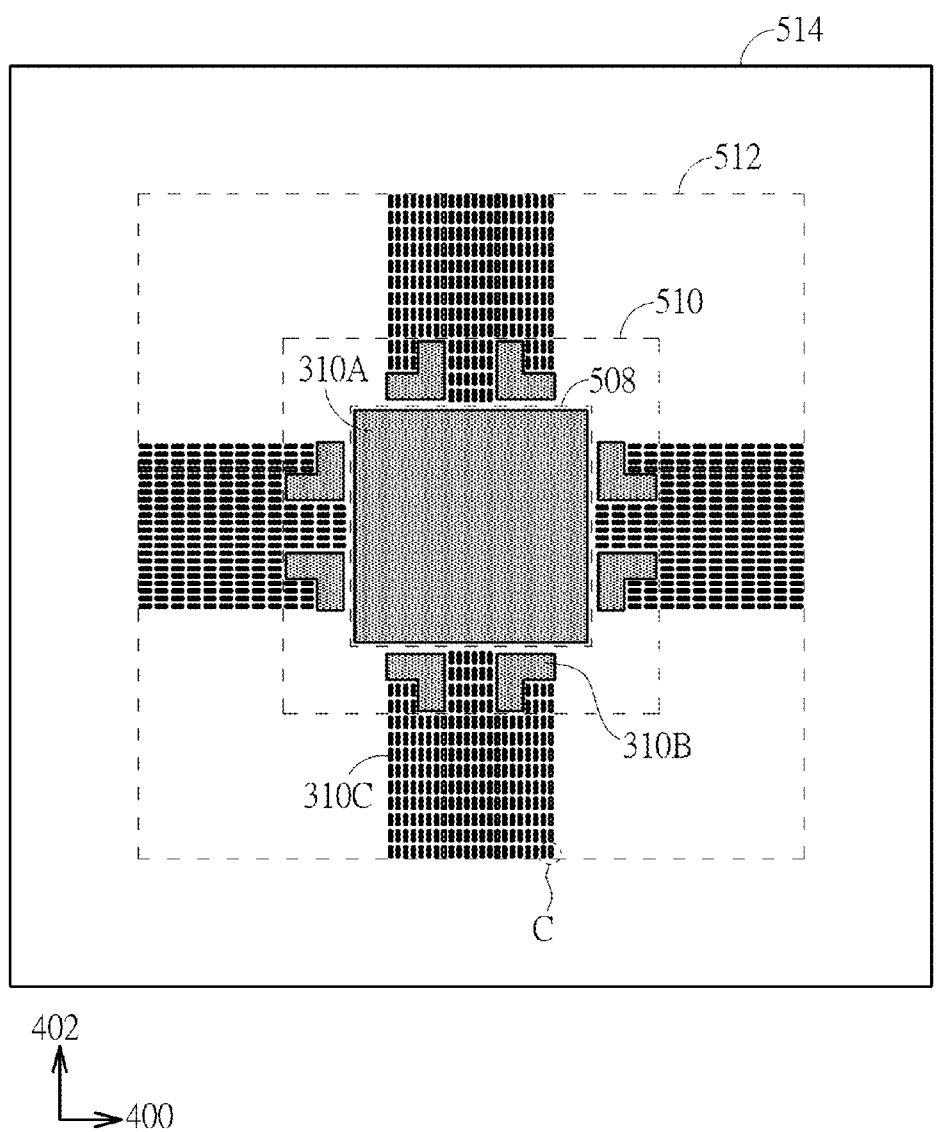

Please see FIG. 6C, which presents an enlarged picture showing an overall pattern of the second patterned layer 310 in region 514, wherein circle C shows the enlarged area in FIG. 6C correspondingly. As depicted in FIG. 6C, the second patterned layer 310 has a cross shape, and the second patterned layer 310 is a mirror symmetrical pattern. As shown in FIG. 6C, the second patterned layer 310 has a second square 310A in the central region 508, a plurality of L-shape 310B in the middle region 510, and a plurality of second blocks 310C in the middle region 508 and the peripheral region 510. Each second blocks 306C preferably has a rectangular contour, and an enlarged figure of each second block 306C is shown in FIG. 6B. In this embodiment, each second block 306C has two second line 306D, each of which is parallel to the spacer 308 and stretching along the second direction 402. Preferably, the second line 306D are located at an outer side of the spacers 308.

Figure 7A:
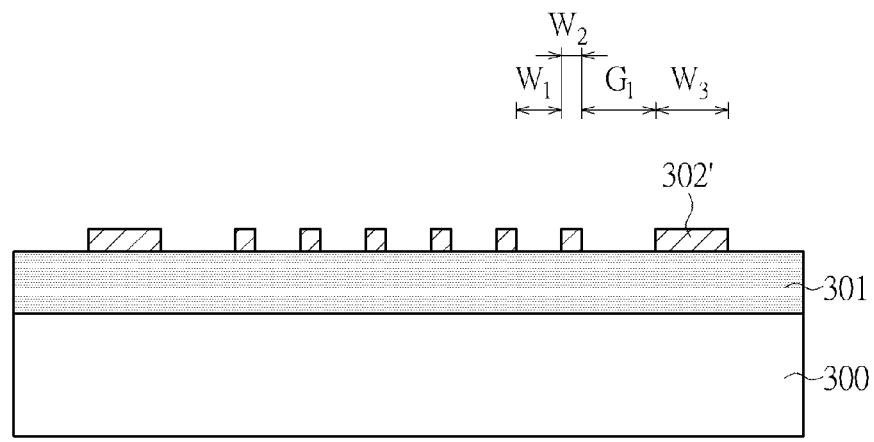
Figure 7B:
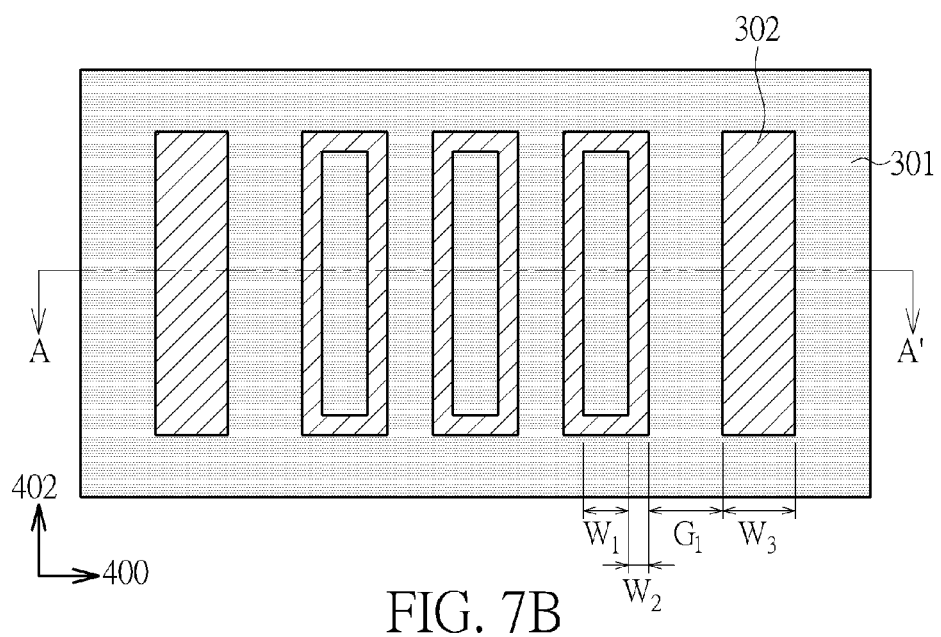

As shown in FIG. 7A and FIG. 7B, the mask layer 302 is patterned by using the spacer 308 and the second patterned layer 310 as a mask, thereto transfer the patterns thereof to form the patterned mask layer 302'.

Figure 8A:
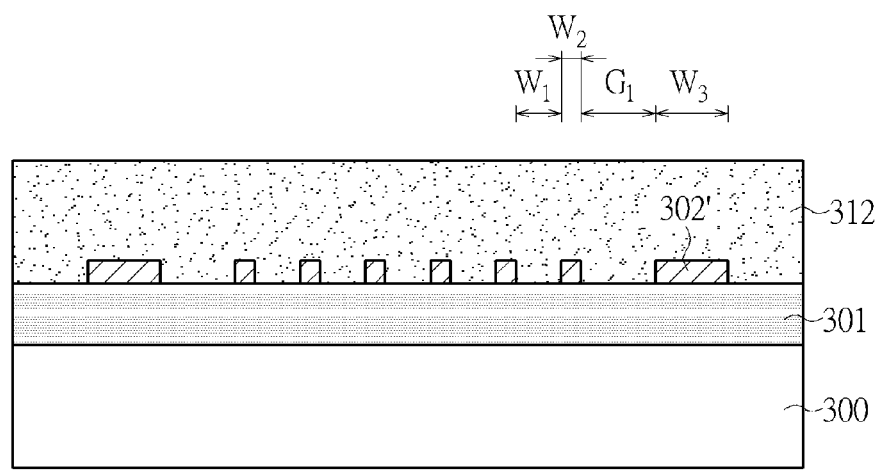
Figure 8B:
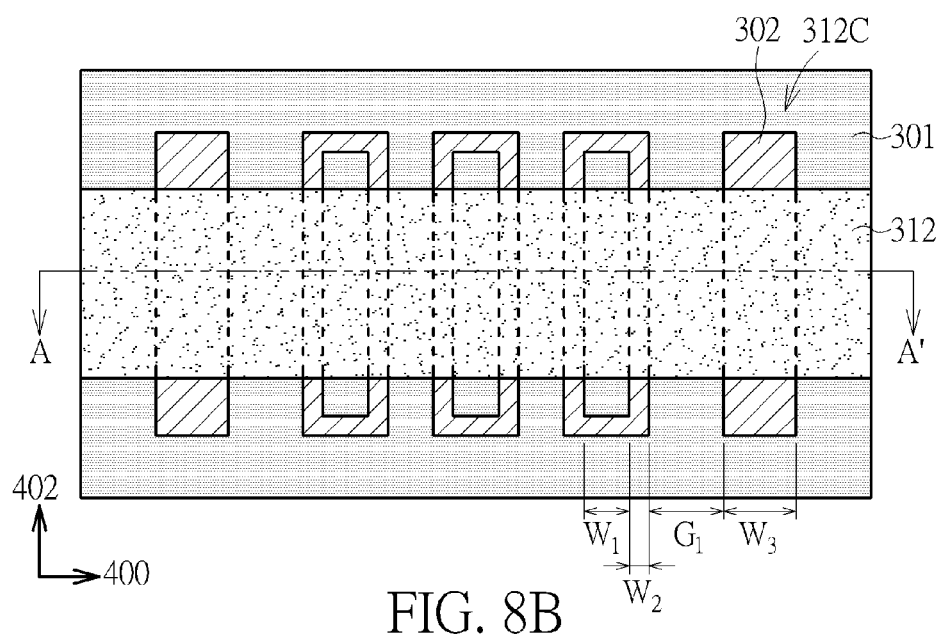
Figure 8C:
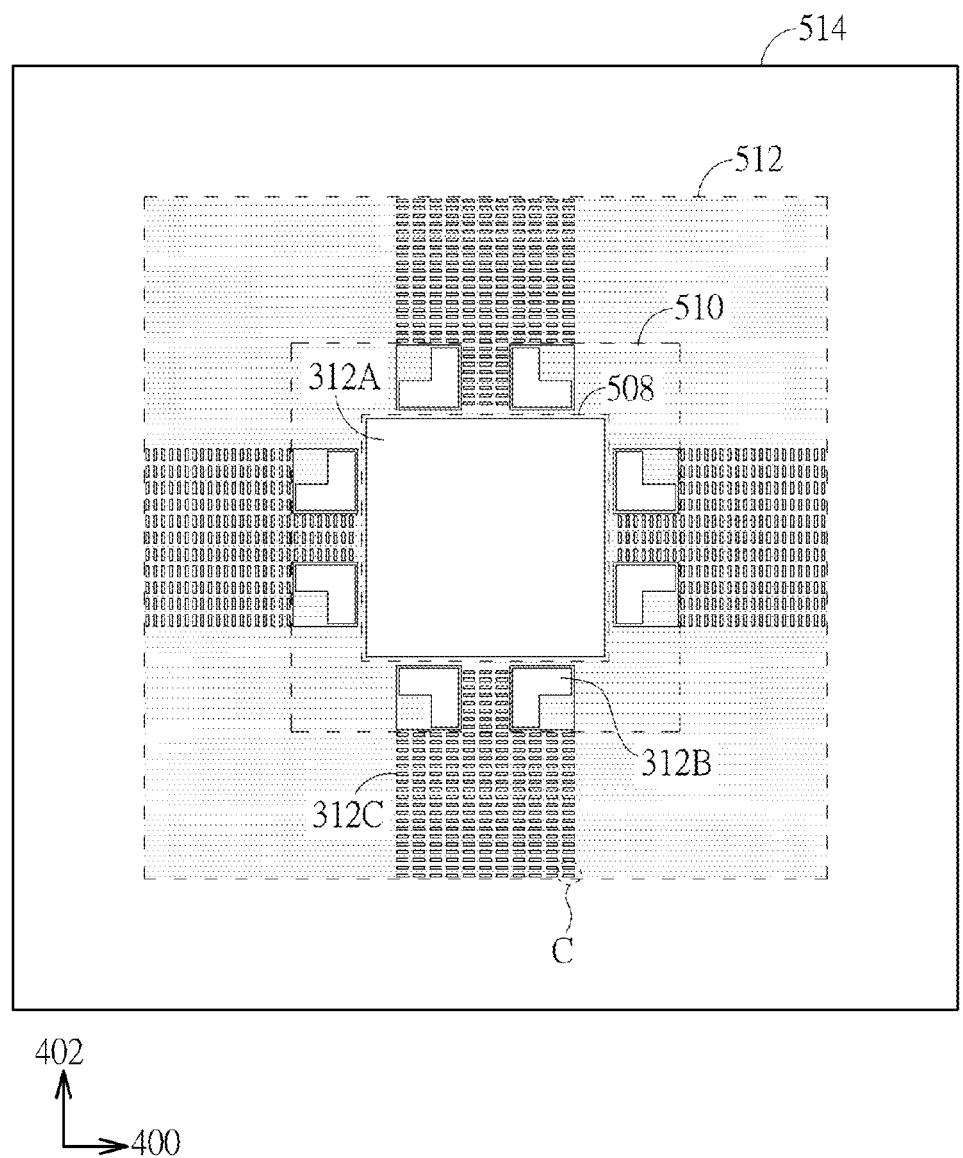

Next, as shown in FIG. 8A and FIG. 8B, a third patterned layer 312 is formed on the gate layer 301 for covering a part of the patterned mask layer 302', by using the second patterned layer 306 for aligning. From the top view of FIG. 8B, it is shown that the central portion of each reticle pattern of the patterned mask layer 302' is covered by the third patterned layer 312 while two terminal parts of each reticle are exposed. Please see FIG. 8C, which presents an enlarged picture showing an overall pattern of the third patterned layer 312 in region 514, wherein circle C shows the enlarged area in FIG. 8C correspondingly. As depicted in FIG. 8C, the third patterned layer 312 has lots of openings which are arranged in a cross shape. The openings of the third patterned layer 312 is a mirror symmetrical pattern. As shown in FIG. 8C, the third patterned layer 312 has a third square hole 312A in the central region 508, a plurality of L-shaped holes 312B in the middle region 510, and a plurality of third line holes 312C in the middle region 508 and the peripheral region 510. In one embodiment, the third square hole 312A is slight smaller than the second square 310A in FIG. 6C, and the L shaped holes 312B are located correspondingly and are slightly smaller than the second L-shapes 310B. With reference back to FIG. 8B, the third line holes 312C is stretching along the first direction 400 and exposes two terminals of the patterned mask layer 302'.

Figure 9A:
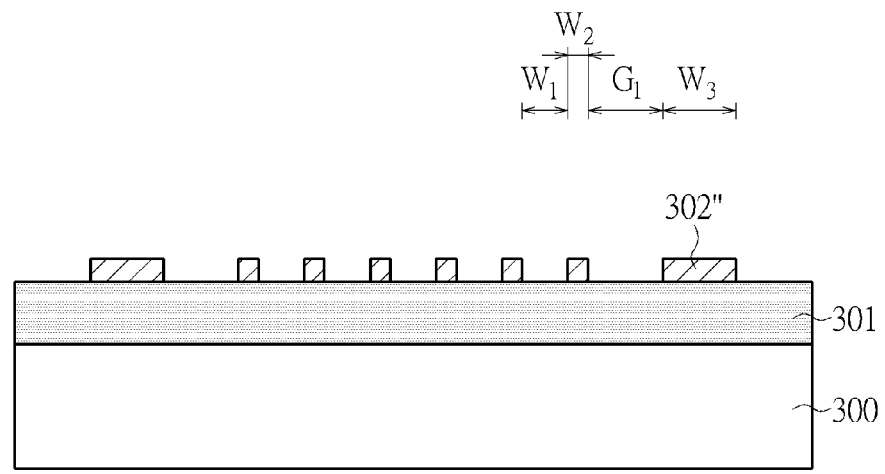
Figure 9B:
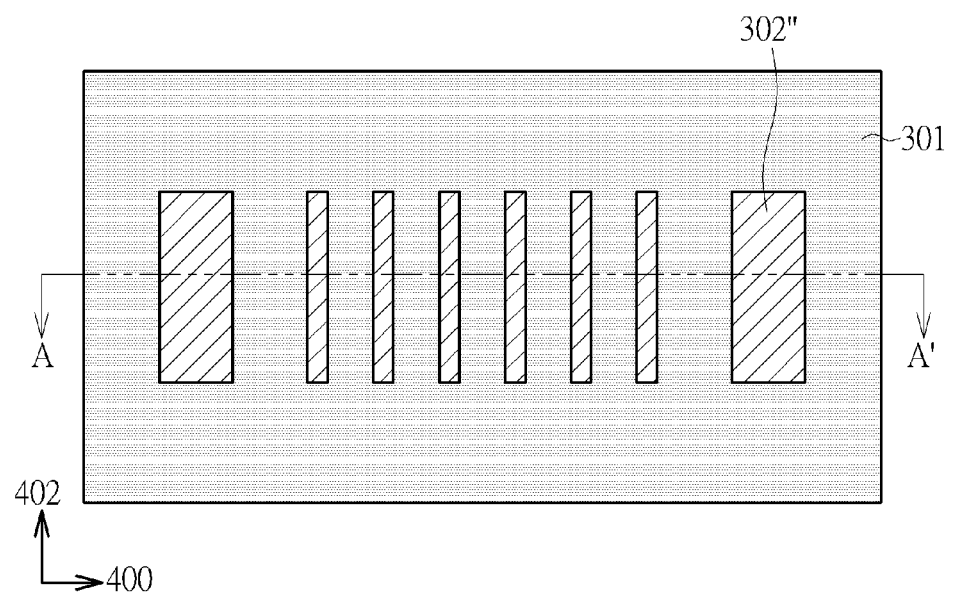

As shown in FIG. 9A and FIG. 9B, patterning the patterned material layer 302' by using the third patterned layer 312 as a mask, removing the exposed portion of the patterned material layer 302'. Thus, the two terminals the patterned material layer 302' are therefore "cut" by the patterning process. The patterned material layer 302", which has been subjected to two patterning process, therefore has a plurality of line patterns stretching along the second direction 402. As shown in FIG. 9B, the patterned material layer 302' has a plurality of line patterns, which were originally formed by the spacer 308 and the second lines 310. Accordingly, the patterned material layer 302' has a line with greater width $W_3$ and a line with less width $W_1$.

Figure 10A:
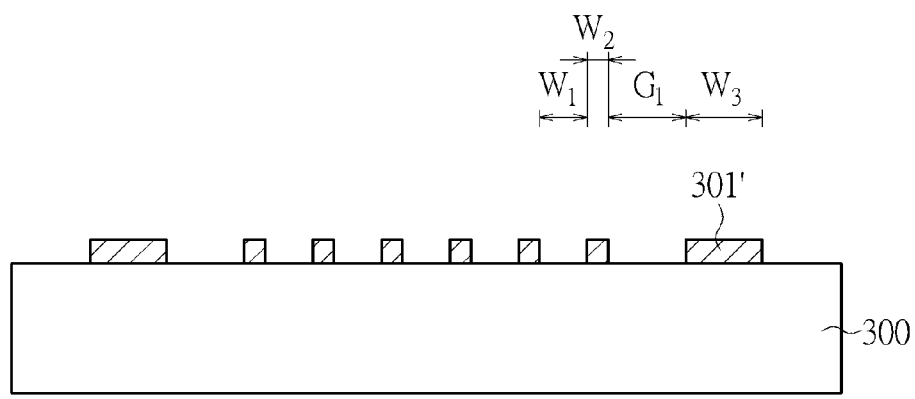
Figure 10B:
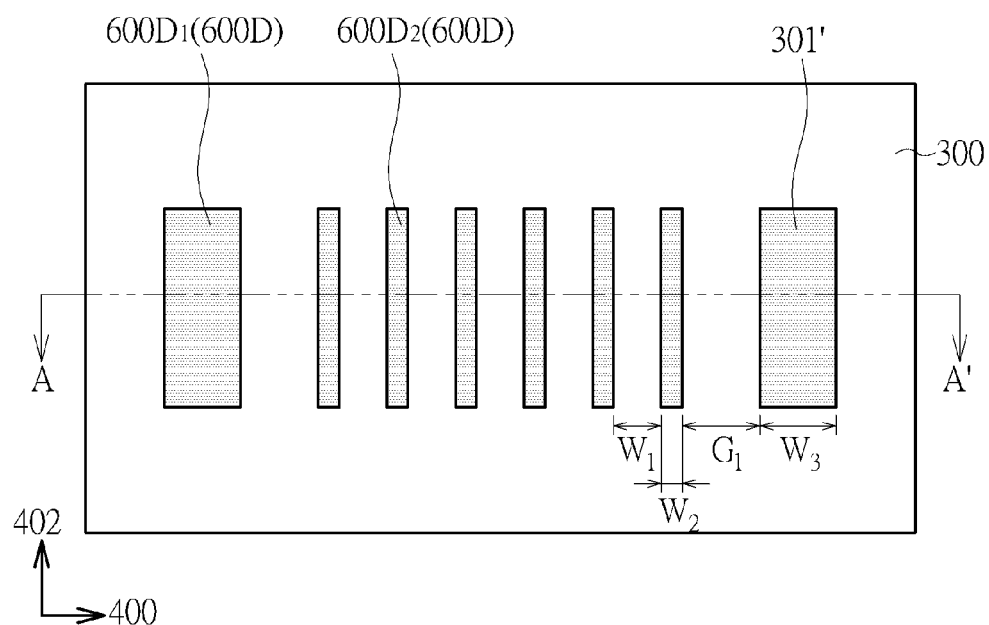
Figure 10C:
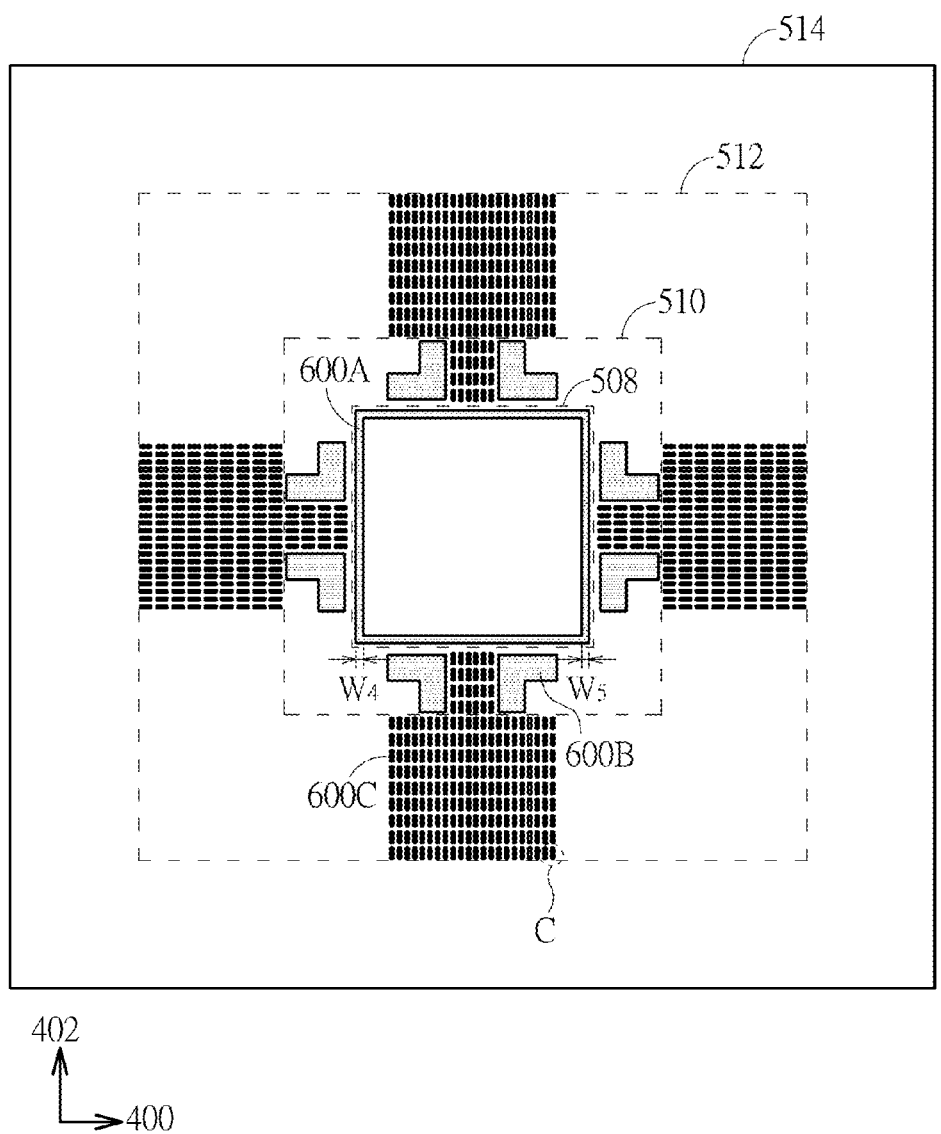

As shown in FIG. 10A and FIG. 10B, the gate layer 301 is patterned by using the patterned mask layer 302" as a mask to form a patterned gate layer 301'. The patterned gate layer 301' therefore has substantially the same pattern as the patterned mask layer 302'. Please see FIG. 10C for the full view of the aligning mark, wherein circle C shows the enlarged area in FIG. 10B correspondingly. As shown, the patterned gate layer 301' in region 514 therefore becomes the final aligning mark 600.

As shown, the aligning mark 600 has an aligning square 600A in the central region 508, a plurality of aligning L-shapes 600B in the middle region 510, a plurality of aligning blocks 600C in the peripheral region 512 and the middle region 510. The aligning square 600A is hollow and the border has a width $W_4$. The aligning L-shape 600B are adjacent to the aligning square 600A and has a width $W_5$. The aligning blocks 600C preferably has a rectangular contour, and an enlarged figure thereof is shown in FIG. 10B. In the present embodiment, each aligning block 400C has a plurality of aligning lines 600D stretching along the second direction 400. The aligning lines 600D can be divided into two groups: an outer aligning lines $600D_1$ positioned at two outer sides and a plurality of inner aligning lines $600D_2$ positioned between the two outer aligning lines $600D_1$. The outer aligning lines $600D_1$ has a width $W_3$ greater than the width $W_2$ of the spacer 308. In one embodiment, the width $W_3$ is five or more than five times greater the width $W_2$. In one embodiment, $W_3$ is about 70 to 80 angstroms and $W_2$ is about 5 to 15 angstroms. The gap $G_1$ between the inner aligning line $600D_2$ and the outer aligning line $600D_1$ can be the same as the gap $W_1$ between the inner aligning line $600D_2$ and the outer aligning line $600D_1$, for example, about 70 to 80 angstroms. In another embodiment, they can be different. Since the inner aligning lines $600D_2$ are formed by a sidewall image transferring (SIT) process, the number of the inner aligning lines $600D_2$ is an even number. Thus, it is also understood that the number of the aligning lines 600D is also an even number. In addition, the aligning lines 600D are formed by SIT process to gain fine width, so in the present invention, the width $W_3$ and $W_2$ of the aligning lines 600D is 10 times less than the width $W_4$ and $W_5$ of the aligning square 600A and the aligning L-shapes 600B.

It is understood that the above aligning marks 600 in the dicing region 506 can be formed simultaneously with the semiconductor devices in the die region 504. For example, when forming the gate lines (not shown) in the die region 504, the patterned gate layer 301' in the dicing region 506 becomes the aligning mark 600, while the patterned gate layer 301' in the die region 504 become gates of transistors. Specifically speaking, the process of forming the inner aligning line $600D_2$ is used to form finer gate lines of finFET while the process to form the outer aligning line $600D_1$ is used to form gate lines of normal transistor. In another embodiment, since the method of forming the gate lines may be modified or altered (such as trimming to gain a finer pitch or processing a metal gate replacement process), the size of the aligning marks 600 can also be changed. However, the relative position or ratio of each component of the aligning mark 600 is not greatly changed.

In summary, the present invention provides a novel aligning mark and the method of making the same. The aligning mark is specifically suitable in SIT process for forming finer FinFET and normal transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a wafer having a dicing region which comprises a central region, a middle region surrounds the central region, and a peripheral region surrounds the middle region;
    an aligning mark disposed in the dicing region, wherein the alignment mark is a mirror symmetrical pattern and comprises:
        a plurality of second patterns in the middle region; and
        a plurality of third patterns disposed in peripheral region, wherein each third pattern comprises a plurality of lines, and a width of the line is 10 times less than a width of the second pattern.

2. The semiconductor structure according to claim 1, wherein the lines in each third pattern are divided into two outer lines and a plurality of inner lines, wherein the outer line has a width greater than that of the inner line.

3. The semiconductor structure according to claim 2, wherein the width of the outer line is more than five times greater than the width of the inner line.

4. The semiconductor structure according to claim 1, wherein the aligning mark is symmetrical by an x axis and a y axis, and the x axis intersects the y axis at a center of the aligning mark.

5. The semiconductor structure according to claim 1, wherein the lines in a part of the third patterns are parallel to the x axis and the lines in the other part of the third patterns are parallel to the y axis.

6. The semiconductor structure according to claim 1, further comprising a first pattern in the central region.

7. The semiconductor structure according to claim 6, wherein the first pattern is a hollow square.

8. The semiconductor structure according to claim 6, wherein the width of the line is 10 times less than a width of the hollow square.

9. The semiconductor structure according to claim 1, wherein the third pattern has a square contour.

10. The semiconductor structure according to claim 1, wherein the third patterns are further disposed in the second region between the second patterns.

* * * * *